(12) United States Patent
Ni et al.

(10) Patent No.: US 8,179,690 B2
(45) Date of Patent: May 15, 2012

(54) CUT-EDGE POSITIONING TYPE SOLDERING STRUCTURE AND METHOD FOR PREVENTING PIN DEVIATION

(75) Inventors: Hsiang-Chih Ni, Taipei (TW); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 190 days.

(21) Appl. No.: 12/841,336

(22) Filed: Jul. 22, 2010

(65) Prior Publication Data

US 2011/0310578 A1 Dec. 22, 2011

(30) Foreign Application Priority Data

Jun. 18, 2010 (TW) .............................. 99119883 A

(51) Int. Cl.
*H05K 7/06* (2006.01)
*H05K 3/34* (2006.01)
(52) U.S. Cl. ........ 361/768; 361/748; 361/760; 361/767; 174/260; 174/263; 228/180.1; 228/180.21; 228/208; 228/209; 29/834; 29/854; 257/734; 257/737; 257/738; 257/E23.01
(58) Field of Classification Search .................. 361/736, 361/743, 745, 748, 760–769, 757, 791, 807, 361/808; 174/250–267; 257/734–738, 774, 257/797, 778, E23.01, E23.02, E21.476; 438/106–118, 611–613, 687; 29/825–856; 228/179.1, 180.1, 180.21, 180.22, 208, 209, 228/262.1, 262.61
See application file for complete search history.

(56) References Cited

U.S. PATENT DOCUMENTS

| | | | | |
|---|---|---|---|---|
| 3,528,173 | A * | 9/1970 | Gall | 29/839 |
| 4,672,739 | A * | 6/1987 | Churchwell et al. | 29/843 |
| 5,313,021 | A * | 5/1994 | Sajja et al. | 174/260 |
| 5,315,485 | A * | 5/1994 | Magill et al. | 361/767 |
| 6,929,169 | B2 * | 8/2005 | Kubokawa et al. | 228/180.1 |
| 6,963,494 | B2 * | 11/2005 | Mickievicz et al. | 361/795 |
| 7,902,666 | B1 * | 3/2011 | Hsu et al. | 257/737 |
| 2011/0239775 | A1 * | 10/2011 | Xie et al. | 73/834 |

FOREIGN PATENT DOCUMENTS

| | | | | |
|---|---|---|---|---|
| JP | 401184995 | A | * | 7/1989 |
| JP | 402047890 | A | * | 2/1990 |
| JP | 04137690 | A | * | 5/1992 |

* cited by examiner

*Primary Examiner* — Michail V Datskovskiy
(74) *Attorney, Agent, or Firm* — Schmeiser, Olsen & Watts, LLP

(57) ABSTRACT

A cut-edge positioning type soldering structure and a method for preventing a pin deviation can prevent a plurality of pins of an electronic component from being deviated when the pins are soldered onto a printed circuit board by a solder, and each of at least two solder pads includes at least two cut edges, and the solder pads are installed in an alignment direction on the printed circuit board, such that the cut-edge positioning type soldering structure and the method for preventing a pin deviation can improve the efficiency of manufacturing processes and reduce the manufacturing cost.

6 Claims, 7 Drawing Sheets

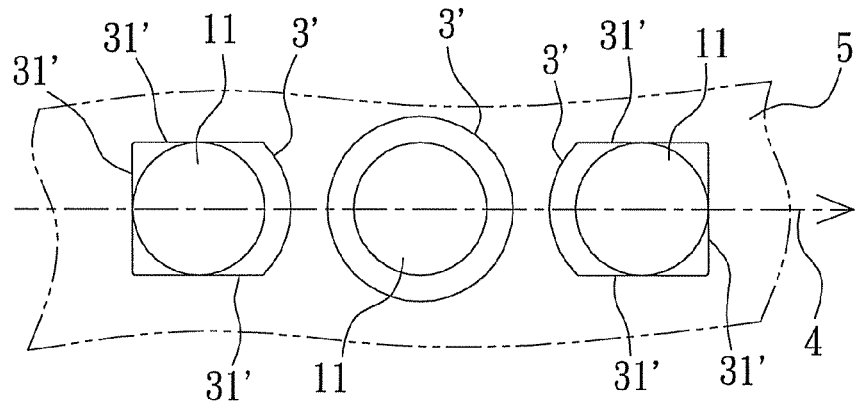

Fig. 7

(1) Form solder pads disposed in an alignment direction on a printed circuit board, wherein the solder pads have a size greater than the size of pins, and each of at least two solder pads includes at least two cut edges, and the cut edges are situated in an area corresponding to the external periphery of the pins.

(2) Use a solder to connect each solder pad with each corresponding pin, and use the cut edges to evenly align edges of the pins to limit a displacement of the pins.

Fig. 8

CUT-EDGE POSITIONING TYPE SOLDERING STRUCTURE AND METHOD FOR PREVENTING PIN DEVIATION

CROSS-REFERENCE TO RELATED APPLICATION

This non-provisional application claims priority under 35 U.S.C. §119(a) on Patent Application No(s). 099119883 filed in Taiwan, R.O.C. on Jun. 18, 2010, the entire contents of which are hereby incorporated by reference.

FIELD OF THE TECHNOLOGY

The present invention relates to a cut-edge positioning type soldering structure and a method for preventing a pin deviation, in particular to those having at least one cut edge formed separately on at least two of many solder pads.

BACKGROUND

As the electronic industry blooms, electronic devices or products are introduced to the market continuously. To improve the production capacity of the electronic devices or products, manufacturers adopt a surface mount technology (SMT) in related manufacturing processes. With reference to FIGS. 1 to 3 for an exploded view and a perspective view of a conventional electronic component soldered onto a printed circuit board and a top view of a pin, a solder and a solder pad when an electronic component is soldered onto a printed circuit board, the printed circuit board 9 includes a plurality of solder pads 8, and the electronic component 6 includes a plurality of pins 61, wherein the solder pads 8 have a size greater than the size of the pins 61, and the solder 7 is coated onto the solder pads 8. When the electronic component 6 is soldered onto the printed circuit board 9, the pins 61 of the electronic component 6 are inserted into the solder 7 on the solder pads 8, and then the printed circuit board 9 is sent to a soldering furnace to heat and melt the solder 7, and then the temperature of the printed circuit board 9 is dropped to room temperature, such that the solder 7 is solidified to fix the pins 61 of the electronic component 6. However, the melted solder 7 is in a liquid form, and the solder pads 8 have a size greater than the size of the pins 61, such that in the solidification process of the solder 7, the pins 61 of the electronic component 6 will be shifted horizontally on the solder pads 8. After the solder 7 is solidified, the pins 61 of the electronic component 6 are deviated with respect to the solder pads 8 (as shown in FIG. 3). The aforementioned result not only causes problems to the manufacturing processes that follow and reduces the efficiency of the manufacturing processes, but also requires a rework of defectives and increases the manufacturing cost.

Therefore, it is an important subject for the present invention to develop a cut-edge positioning type soldering structure and a method for preventing a pin deviation to improve the efficiency of manufacturing processes and reducing the manufacturing cost.

SUMMARY

In view of the foregoing shortcomings of the prior art, it is a primary objective of the present invention to provide a cut-edge positioning type soldering structure and a method for preventing a pin deviation to achieve the effects of improving the efficiency of manufacturing processes and reducing the manufacturing cost.

To achieve the foregoing objective, the present invention provides a first embodiment, which is a cut-edge positioning type soldering structure comprising a plurality of solder pads installed on a printed circuit board for connecting SMT electronic components having a plurality of pins, and the solder pads have a size greater than the pins, characterized in that each solder pad is situated in an alignment direction on the printed circuit board, wherein each of at least two solder pads has at least two cut edges, and the cut edges are situated in an area corresponding to the external periphery of the pins and provided for evenly aligning edges of the pins to limit a displacement of the pins.

The present invention provides a second embodiment, which is a method for preventing a pin deviation, and the method is applied to a printed circuit board soldered with SMT electronic components having a plurality of pins, and the method comprises the following steps:

Form a plurality of solder pads in an alignment direction on a printed circuit board, wherein the solder pads have a size greater than the size of the pins, and each of at least two solder pads has at least two cut edges, and the cut edges are situated in an area corresponding to the external periphery of the pins; and Connect the solder pads to the corresponding pins respectively by a solder, wherein the cut edges are provided for evenly aligning an edge of the pin to limit a displacement of the pin.

Therefore, the cut-edge positioning type soldering structure and the method for preventing a pin deviation according to the present invention can improve the efficiency of manufacturing processes and reduce the manufacturing cost.

BRIEF DESCRIPTION OF THE DRAWINGS

FIG. 7 is a top view of a pin, a solder and a solder pad in accordance with a second preferred embodiment of the present invention; and FIG. 8 is a flow chart in accordance with a preferred embodiment of the present invention.

DESCRIPTION

The objects, characteristics and effects of the present invention will become apparent with the detailed description of the preferred embodiments and the illustration of related drawings as follows.

Figure 1:
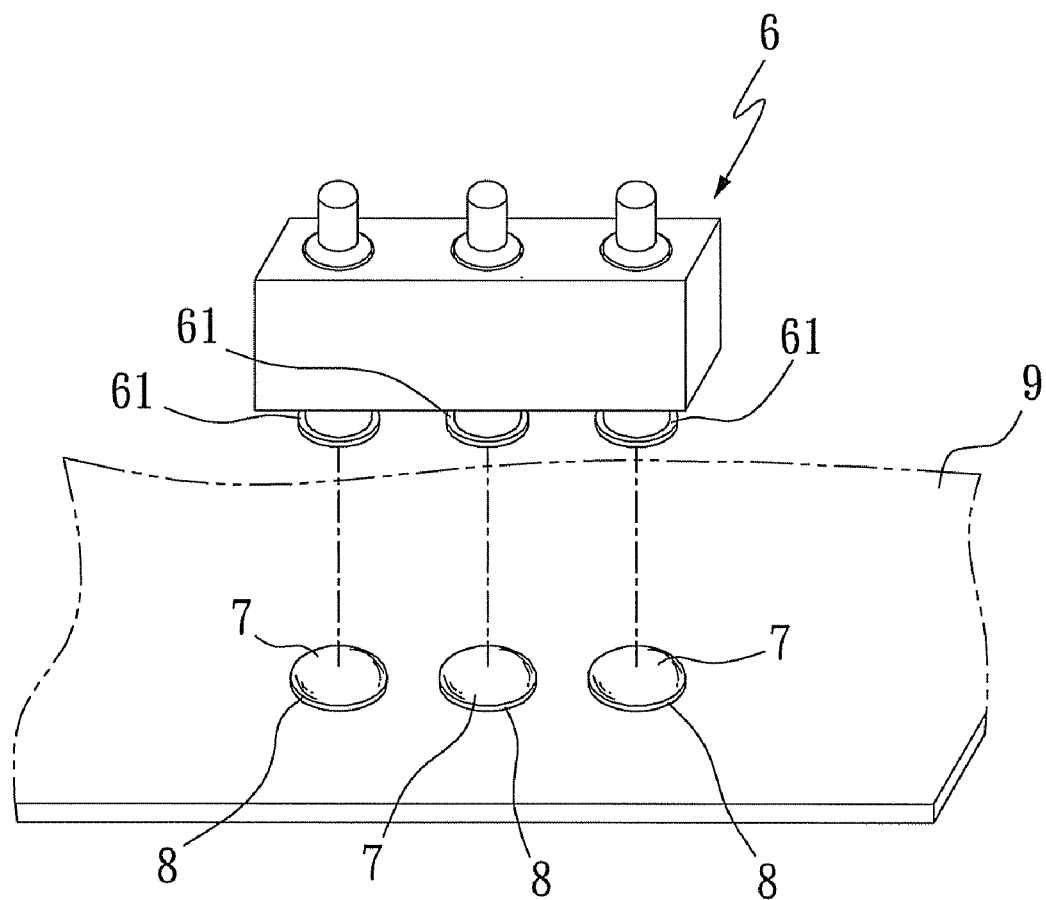
FIG. 1 is an exploded view of a conventional electronic component soldered onto a printed circuit board.
Figure 2:
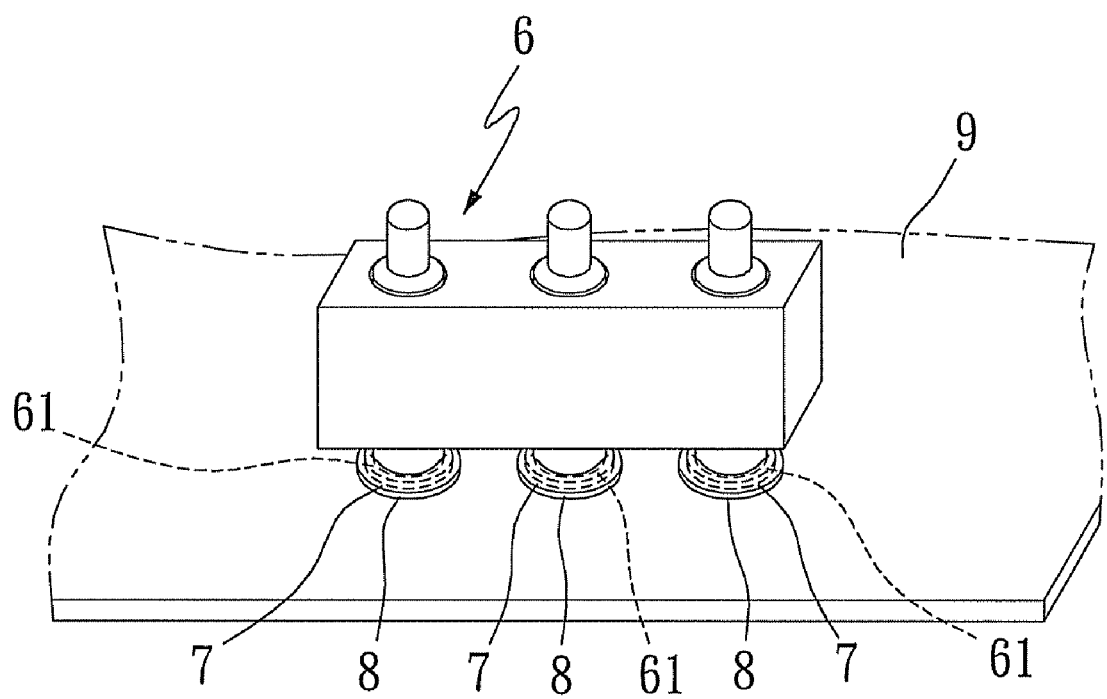
FIG. 2 is a perspective view of a conventional electronic component soldered onto a printed circuit board.
Figure 3:
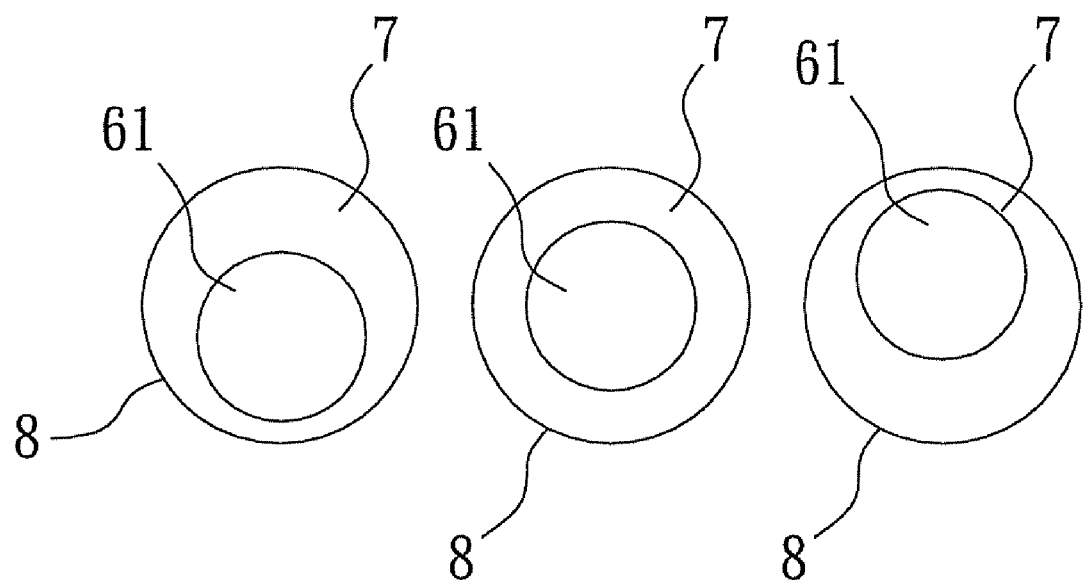
FIG. 3 is a top view of a pin, a solder and a solder pad when a conventional electronic component is soldered onto a printed circuit board.
Figure 4:
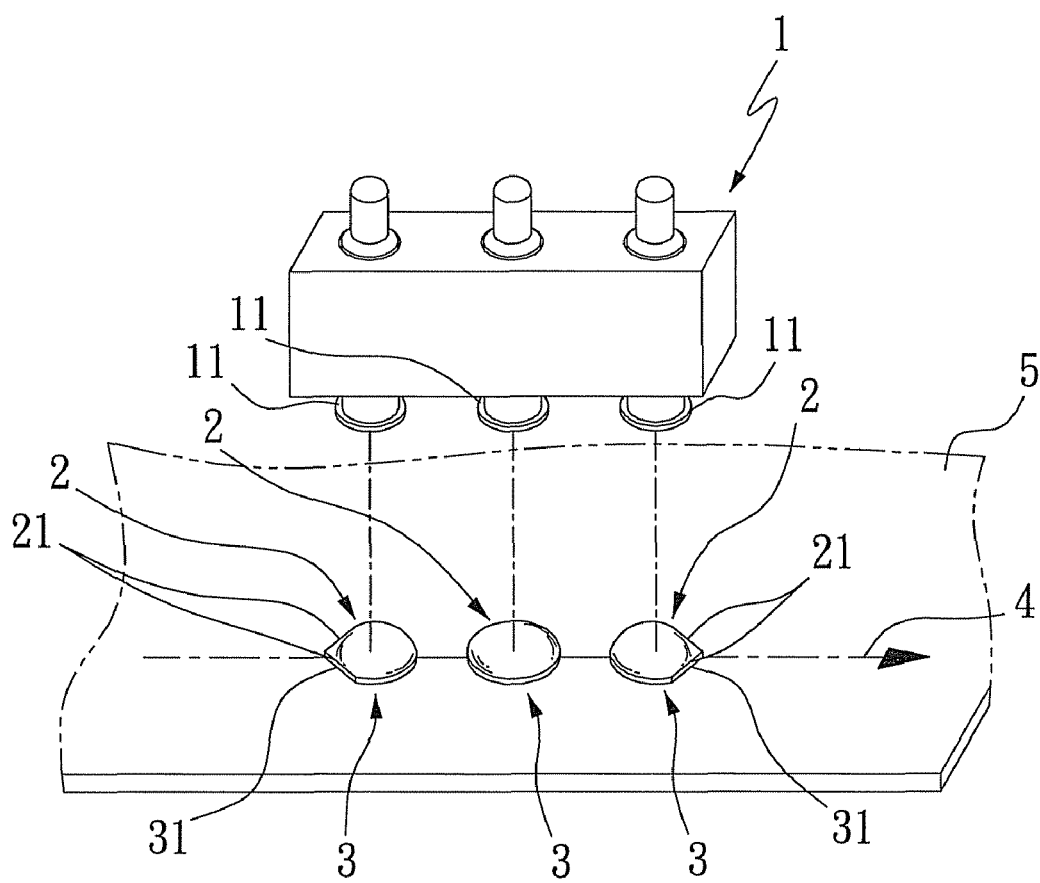
FIG. 4 is an exploded view of a first preferred embodiment of the present invention.
Figure 5:
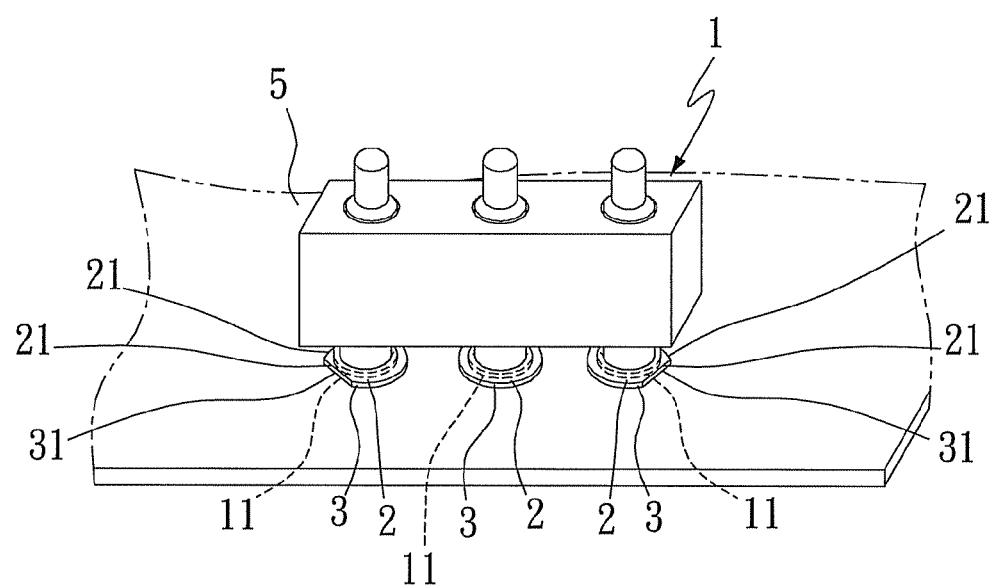
FIG. 5 is a perspective view of a first preferred embodiment of the present invention.
Figure 6:
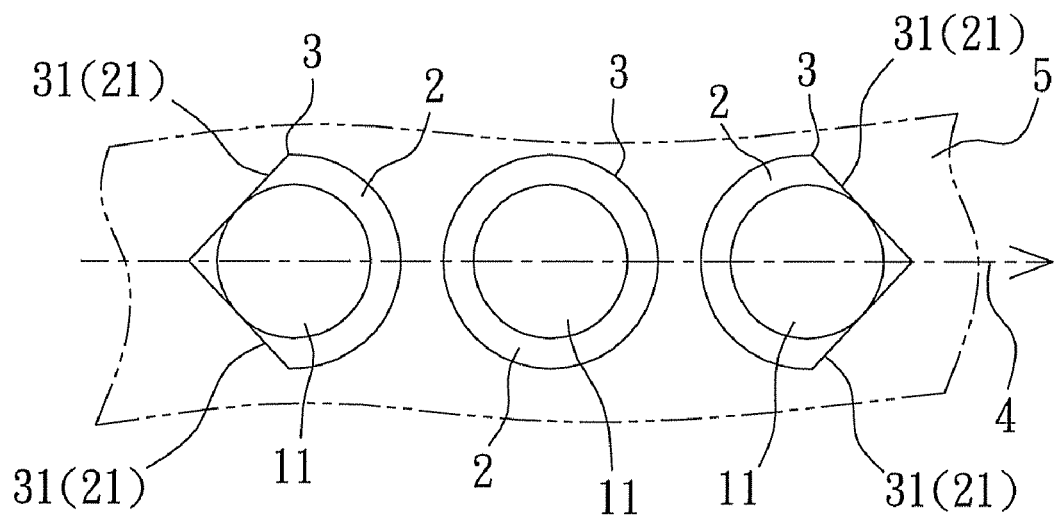
FIG. 6 is a top view of a pin, a solder and a solder pad in accordance with a first preferred embodiment of the present invention.

With reference to FIGS. 4 to 6 for an exploded view and a perspective view of a first preferred embodiment of the present invention, and a top view of a pin, a solder and a solder pad respectively, the present invention provides a first embodiment of a cut-edge positioning type soldering structure, comprising a plurality of solder pads 3 installed on a printed circuit board 5 for connecting a SMT electronic component 1 having a plurality of pins 11, wherein the solder pads 3 have a size greater than the size of the pins 11, and the pins 11 comes with a circular shape and a quantity of two or more, and three pins 11 are shown in the figures for illustrating the embodiment of the invention, and the quantity of solder pads 3 corresponds to the quantity of pins 11. The cut-edge positioning type soldering structure of the present invention is characterized in that each solder pad 3 is disposed in an alignment direction 4 of the printed circuit board 5, wherein each of at least two solder pads 3 includes at least two cut edges 31, the at least two solder pads 3 can be leftmost and rightmost solder pads 3, two left solder pads 3, two right solder pads or three solder pads 3. In the figures, the leftmost and rightmost solder pads 3 are adopted for illustrating the invention, and the quantity of cut edges 31 can be two or more, and two cut edges 31 are shown in the figures for illustrating the invention, and the cut edges 31 are disposed in an area corresponding to the external periphery of the pin 11 during the soldering process and provided for aligning edges of the pins 11 to limit a displacement of the pins 11.

If it is necessary to solder the pins 11 of the electronic component 1 onto the printed circuit board 5, the solder pads 3 is coated with a solder 2 first, wherein a moldboard (not shown in the figure) having a plurality of penetrating holes (not shown in the figure) is covered onto the printed circuit board 5, and the penetrating holes are disposed at positions corresponding to the positions of the solder pads 3, and the shape and size of the penetrating holes are the same as those of the solder pads 3, and then a solder such as a solder paste is coated onto the penetrating holes. After the moldboard is removed, a solder 2 is coated onto the solder pads 3, and the shape and size of the solder 2 are the same as those of the solder pads 3, and cut edges 21 are formed, and then the pins 11 of the electronic component 1 are inserted into the solder 2 on the solder pads 3, and then the printed circuit board 5 is sent into a soldering furnace (not shown in the figure) to heat and melt the solder 2, and then allow the temperature of the printed circuit board 1 to drop back to room temperature, such that the solder 2 is solidified gradually. During the solidification process of the solder 2, the cut edges 31 of the solder pads 3 do not have any solder, so that towards the cut edges 31. In other words, the cut edges 31 limit the positions of the pins 11 of the electronic component 1, such that during the solidification process of the solder 2, the pins 11 of the electronic component 1 will not be shifted with respect to the solder pads 3. Until the solidification of the solder 2 completes, the pins 11 of the electronic component 1 on the solder pads 3 will not be deviated.

Since the size of the solder pads 3 is greater than the size of the pins 11, therefore the size of solder 2 on the solder pads 3 is also greater than the size of the pins 11. If the pins 11 of the electronic component 1 are soldered to the printed circuit board 5, the solder 2 situated below the pins 11 is provided for adhering with the pins 11, and the solder 2 situated outside the pins 11 is provided for wrapping the pins 11 to secure the soldered pins 11.

At least two cut edges 31 are formed respectively on at least two of the aforementioned solder pads 3 (wherein the leftmost solder pad 3' and the rightmost solder pad 3 are shown in the figures for the illustration, but they can be two left solder pads 3, or two right solder pads 3), and the cut edges 31' are disposed on both sides of the alignment direction 4, such as along a diagonal of the solder pads 3. In the figures, the cut edges 31 disposed on both sides of the alignment direction 4 prevent the pins 11 of the electronic component 1 from shifting up and down or left and right, and from rotating with respect to the solder pads 3. In other words, the pins 11 of the electronic component 1 will not be deviated with respect to the solder pads 3.

With reference to FIG. 7 for a top view of a pin, a solder and a solder pad in accordance with a second preferred embodiment of the present invention, at least three cut edges 31' are formed respectively on at least two solder pads 3' (wherein the leftmost solder pad 3', and the rightmost solder pad 3' are shown in the figure for the illustration, but they can be two left solder pads 3', or two right solder pads 3'), and two cut edges 31' are disposed in the alignment direction 4, and the remaining cut edge 31' is disposed on both sides of the alignment direction 4. In the figure, the cut edges 31' disposed in the alignment direction and on both sides of the alignment direction 4 prevent the pins 11 of the electronic component from shifting up and down or left and right, and from rotating with respect to the solder pads 3'. In other words, the pins 11 of the electronic component will not be deviated with respect to the solder pads 3'.

With reference to FIG. 8 for a flow chart of a preferred embodiment of the present invention together with FIGS. 4 to 6, a method for preventing a pin deviation in accordance with a second embodiment of the present invention is applied to solder a SMT electronic component 1 having a plurality of pins 11 onto a printed circuit board 5, wherein the quantity of pins 11 can be two or more, and three pins 11 are shown in the figures for the illustration, and the quantity of pins 11 is equal to the quantity of solder pads 3, and the method comprises the following steps:

(1) A plurality of solder pads 3 disposed in an alignment direction 4 are formed on the printed circuit board 5, wherein the solder pads 3 have a size greater than the size of the pins 11, and each of at least two solder pads 3 includes at least two cut edges 31, and the cut edges 31 are situated in an area corresponding to the external periphery of the pins 11, and the at least two solder pads 3 can be leftmost and rightmost solder pads 3, two left solder pads 3, two right solder pads 3 or three solder pads 3. In the figures, the leftmost and rightmost solder pads 3 are shown for the illustration of the invention, and the quantity of cut edges 31 can be two or more, and two cut edges 31 is shown in the figure for the illustration of the invention.

(2) A solder 2 is used for connecting each solder pad 3 with each corresponding pin 11, and the cut edges 31 are provided for evenly aligning edges of the pins 11 to limit a displacement of the pins 11 during a soldering process.

If it is necessary to solder the pins 11 of the electronic component 1 onto the printed circuit board 5, the solder pads 3 is coated with a solder 2 first, wherein a moldboard (not shown in the figure) having a plurality of penetrating holes (not shown in the figure) is covered onto the printed circuit board 5, and the penetrating holes are disposed at positions corresponding to the positions of the solder pads 3, and the shape and size of the penetrating holes are the same as those of the solder pads 3, and then a solder such as a solder paste is coated onto the penetrating holes. After the moldboard is removed, a solder 2 is coated onto the solder pads 3, and the shape and size of the solder 2 are the same as those of the solder pads 3, and a cut edge 21 is formed, and then the pins 11 of the electronic component 1 are inserted into the solder 2 on the solder pads 3, and then the printed circuit board 5 is sent into a soldering furnace (not shown in the figure) to heat and melt the solder 2, and then allow the temperature of the printed circuit board 1 to drop back to room temperature, such that the solder 2 is solidified gradually. During the solidification process of the solder 2, the cut edges 31 of the solder pads 3 do not have any solder, so that the pins 11 of the electronic component 1 will not shift towards the cut edges 31. In other words, the cut edges 31 limit the positions of the pins 11 of the electronic component 1, such that during the solidification process of the solder 2, the pins 11 of the electronic component 1 will not be shifted with respect to the solder pads 3. Until the solidification of the solder 2 completes, the pins 11 of the electronic component 1 on the solder pads 3 will not be deviated.

Since the size of the solder pads 3 is greater than the size of the pins 11, therefore the size of solder 2 on the solder pads 3 is also greater than the size of the pins 11. If the pins 11 of the electronic component 1 are soldered to the printed circuit board 5, the solder 2 situated below the pins 11 is provided for adhering with the pins 11, and the solder 2 situated outside the pins 11 is provided for wrapping the pins 11 to secure the soldered pins 11.

In the aforementioned procedure, a cut edge 31 is formed separately on two sides of at least two solder pads 3 such as a diagonal of the alignment direction. In the figures, the cut edges 31 disposed on both sides of the alignment direction 4 prevent the pins 11 of the electronic component 1 from shifting up and down or left and right, and also prevent the pins 11 of the electronic component 1 from being rotated with respect to the solder pads 3. In other words, the pins 11 of the electronic component will not be deviated with respect to the solder pads.

With reference to FIGS. 7 and 8, at least three cut edges 31' are formed on at least two solder pads 3' (the leftmost solder pad 3' and the rightmost solder pad 3' are shown in the figure for the illustration of the present invention, but they can also be two left solder pads 3", or two right solder pads 3'), and the two cut edges 31' are disposed in the alignment direction 4, and the remaining cut edge 31' is disposed on both sides of the alignment direction 4. In the figures, the cut edges 31' disposed on in the alignment direction and on both sides of the alignment direction 4 prevent the pins 11 of the electronic component from shifting up and down or left and right, and from rotating with respect to the solder pads 3'. In other words, the pins 11 of the electronic component will not be deviated with respect to the solder pads 3'.

In summation of the description above, the present invention complies with patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A cut-edge positioning type soldering structure, comprising a plurality of solder pads installed on a printed circuit board, for connecting a SMT electronic component having a plurality of pins, and the solder pads having a size greater than the size of the pins, characterized in that each solder pad is disposed in an alignment direction of the printed circuit board, and each of at least two solder pads includes at least two cut edges, and the cut edges are disposed in an area corresponding to the external periphery of the pins for evenly aligning edges of the pins to limit a displacement of the pins.

2. The cut-edge positioning type soldering structure of claim 1, wherein the cut edges are disposed on both sides of the alignment direction.

3. The cut-edge positioning type soldering structure of claim 1, wherein the each of at least two solder pads includes at least three cut edges, and the two edges are disposed in the alignment direction and the remaining edge is disposed on both sides of the alignment direction.

4. A method for preventing a pin deviation, applied to a printed circuit board soldered with a SMT electronic component having a plurality of pins, and the method comprising the steps of:
forming a plurality of solder pads in an alignment direction on the printed circuit board, wherein the solder pads have a size greater than the size of the pins, and each of at least two solder pads includes at least two cut edges, and the cut edges are disposed in an area corresponding to the external periphery of the pins; and connecting each solder pad to the corresponding pin by a solder, such that the cut edges are provided for evenly aligning edges of the pins to limit a displacement of the pins.

5. The method of claim 4, wherein the cut edges are disposed on both sides of the alignment direction.

6. The method of claim 4, wherein each of at least two solder pads forms at least three cut edges respectively, and the two cut edges are disposed in the alignment direction, and the remaining cut edge is disposed on both sides of the alignment direction.

* * * * *